(12) United States Patent
Kim

(10) Patent No.: US 7,456,060 B2
(45) Date of Patent: Nov. 25, 2008

(54) NONVOLATILE MEMORY DEVICE AND METHOD FOR FABRICATING THE SAME

(75) Inventor: Heong Jin Kim, Chilgok-gun (KR)

(73) Assignee: Dongbu Electronics Co., Ltd., Seoul (KR)

( * ) Notice: Subject to any disclaimer, the term of this patent is extended or adjusted under 35 U.S.C. 154(b) by 264 days.

(21) Appl. No.: 11/320,860

(22) Filed: Dec. 30, 2005

(65) Prior Publication Data

US 2007/0063254 A1 Mar. 22, 2007

(30) Foreign Application Priority Data

Sep. 21, 2005 (KR) ............... 10-2005-0087691

(51) Int. Cl.
*H01L 21/8238* (2006.01)

(52) U.S. Cl. ............... 438/201; 438/211; 257/314; 257/315; 257/E21.422; 257/E21.68; 257/E21.687; 257/E29.129; 257/E29.3

(58) Field of Classification Search ............... 438/201, 438/211; 257/314, 315, E21.422, E21.68, 257/E21.687, E29.129, E29.3

See application file for complete search history.

(56) References Cited

U.S. PATENT DOCUMENTS

| 4,881,108 A | * | 11/1989 | Yoshikawa | ............... 257/324 |
| 2002/0045304 A1 | * | 4/2002 | Lee | ............... 438/201 |

* cited by examiner

*Primary Examiner*—Long K Tran
(74) *Attorney, Agent, or Firm*—Lowe Hauptman Ham & Berner, LLP

(57) ABSTRACT

A nonvolatile memory device includes a floating gate formed on a tunnel oxide layer that is on a semiconductor substrate. The device also includes a drain region formed in the substrate adjacent to one side of the floating gate, a source region formed adjacent to another side of the floating gate. The source region is apart from the floating gate, and an inter-gate insulating layer formed on a portion of an active region between the source region and the floating gate and on a sidewall of the floating gate directing toward the source region, and on a sidewall of the floating gate directing toward the drain region. The device includes a word line formed over the floating gate and being across the substrate in one direction, and a field oxide layer interposing between the word line and the source region.

10 Claims, 11 Drawing Sheets

SECTION I-I'

SECTION I-I'

SECTION II-II'

SECTION I-I'

SECTION II-II'

SECTION I–I'

SECTION II–II'

SECTION I-I'

SECTION II-II'

SECTION I-I'

SECTION II-II'

NONVOLATILE MEMORY DEVICE AND METHOD FOR FABRICATING THE SAME

This application claims the benefit of Korean Application No. 10-2005-0087691, filed on Sep. 21, 2005, which is hereby incorporated by reference in its entirety.

BACKGROUND OF THE INVENTION

1. Field of the Invention

The present invention relates to a semiconductor memory device technology. More specifically, the present invention relates to nonvolatile memory devices and fabrication method thereof.

2. Description of the Related Art

Flash memory, which is capable of retaining stored data without continued supply of electrical power, has a stacked gate structure of a floating gate and a control gate. The floating gate, which is placed between the control gate and the semiconductor substrate, is isolated by an insulating oxide layer. The flash memory device is classified, according to its cell array structure, into two classifications: NOR flash and NAND flash. The NAND flash has higher integration and is suitable for use in electronic devices requiring high storage capacity. The NOR flash memory allows higher speed and random access to the memory cells but it requires a space for the each of memory cells being interconnected to a bit line and has relatively low integrity.

The NOR flash memory devices have a plurality of memory cells arrayed in row and column directions. Memory cells placed in row direction are connected in parallel to a bit line, while memory cells placed in column direction are connected in parallel to a word line. When memory cells connected to non-selected word line are over-erased, current may flow through the bit line regardless of which memory cells are selected or activated. As a result, all of the memory cells connected to the selected bit lines are erroneously recognized as turned-on cells.

In flash memory device, split gate type device has a word line that overlaps in part the floating gate and functions as both selection gate and control gate.

FIG. 1 is a cross-sectional view of the conventional split gate flash memory cells.

Referring to FIG. 1, drain region 24 is formed in a semiconductor substrate 10. At both sides of the drain region 24, floating gates 12 are formed on tunnel oxides 18 on the substrate 10. The memory cells are formed in active region electrically separated by isolation regions (not shown). On the floating gate 12, gate poly insulating layer 14 having elliptic section is formed and thus sharp edges or tips are present at the edges of the floating gate.

In the active regions, source regions 22 are formed apart from the floating gate 12. Portion of the substrate placed between the source regions 22 and the floating gate and the word line 16 overlying the floating gate overlap. The word line 16 is disposed to come across the isolation layer. Insulating layers 20 are formed between the word line 16 and floating gate 12 and between the word line 16 and active regions.

In a write or programming operation of the split gate flash memory device, the word line 16 overlapping the active regions acts as the gate electrode of a selection transistor to make the channel in the active regions turned-on, and electrons are injected into the floating gate 12 through the tunnel oxide 18 by the capacitive coupling of the floating gate 12 when a predetermined voltage is applied to the drain region 24. In an erase operation of the split gate flash memory device, when an erase voltage is applied to the word line 16, electric charges injected into the floating gate are erased through the tips of the floating gate 12.

With this structure of word line overlapping the portion of active region between the floating gate 12 and the source region 22, turning-on of the memory cells connected to a bit line cannot be detected so long as over-erased memory cells have their selection transistors turned-on, even when the over-erased memory cells share a common bit line.

In spite of this advantage, the conventional split gate flash memory devices have defects in that misalignment of the word line relative to the active region and the floating gate causes variations of transistor characteristics. When the overlapping area of the word line and floating gate varies, the coupling ratio of the cell transistors is changed, and when the overlapping area of the word line and the active region varies, the threshold voltage of the selection transistor is changed.

Further, like the NOR type flash memory device, the split gate flash memory reveals the limitation in increasing integration because the memory cells are fabricated in active regions defined by isolation layers. Moreover, the gate oxide or tunnel oxide is made thinner at interfaces between the isolation layers and the active regions.

SUMMARY OF THE INVENTION

It is, therefore, an object of the present invention to provide a nonvolatile memory device that can maintain uniform the overlapping area of the word line relative to the floating gate and active region.

Another object of the present invention is to provide nonvolatile memory device that can improve the integration of memory cell arrays.

To achieve the above objects, an embodiment of a method for fabricating nonvolatile memory device comprises the steps of: (a) forming a tunnel oxide layer on a semiconductor substrate; (b) forming a floating gate pattern on the tunnel oxide layer; (c) forming an inter-gate insulating layer on the floating gate pattern; (d) forming a drain region in the substrate adjacent to one side of the floating gate pattern; (e) forming a source region in the substrate adjacent to the other side of the floating gate, the source region being apart from the floating gate; (f) forming a gate oxide layer on a portion of an active region between the source region and the floating gate and on a sidewall of the floating gate directing toward the source region, as well as on a sidewall of the floating gate directing toward the drain region; (g) forming field oxide layers on the source and drain regions; (h) forming a word line passing across the floating gate; and (i) forming a floating gate under the word line by etching the floating gate pattern with self-aligned to the word line.

In addition, steps (d) and (e) preferably comprises the steps of: forming spacer patterns on sidewalls of the floating gate directing toward the source region; injecting dopants into regions of the substrate, which are at both sides of the floating gate pattern, with using the spacer patterns and the floating gate patterns as a etch mask; and removing the spacer patterns.

In addition, a nonvolatile memory device according to the present invention, comprises: floating gate formed on a tunnel oxide layer that is formed on a semiconductor substrate; a drain region formed in the substrate adjacent to one side of the floating gate; a source region formed in the substrate adjacent to the other side of the floating gate, the source region being apart from the floating gate; an inter-gate insulating layer formed on a portion of an active region between the source region and the floating gate and on a sidewall of the floating gate directing toward the source region, as well as on a sidewall of the floating gate directing toward the drain region; a word line formed over the floating gate and being across the substrate in one direction; and a field oxide layer interposing between the word line and the source region and between the word line and the drain region, and intersecting the word line.

These and other aspects of the invention will become evident by reference to the following description of the invention, often referring to the accompanying drawings.

DETAILED DESCRIPTION OF THE INVENTION

Hereinafter, embodiments of a nonvolatile memory device and fabrication method thereof, according to the present invention, will be described with reference to FIGS. 1 to 6c.

Figure 1:
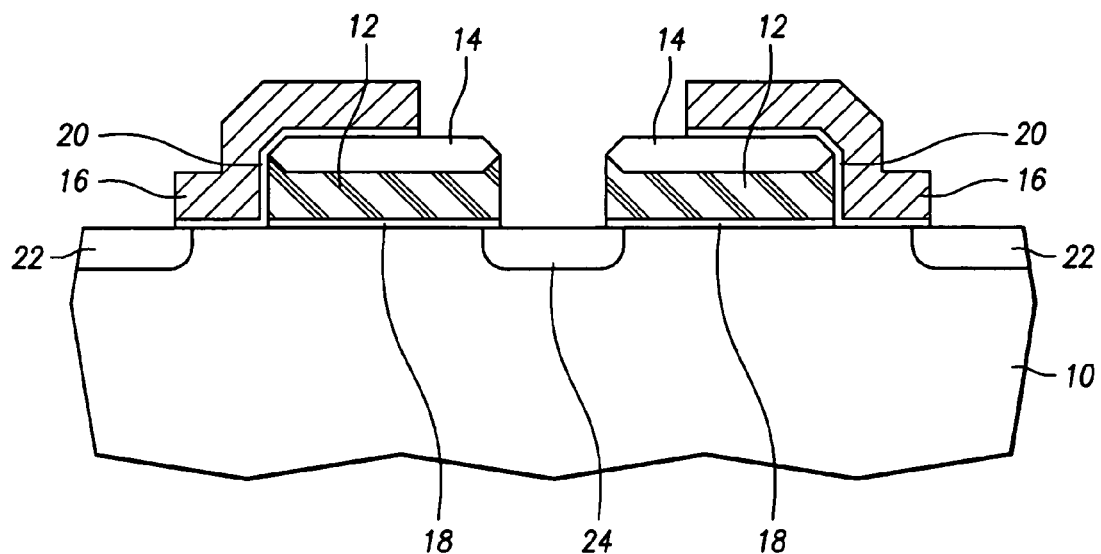
FIG. 1 is a cross-sectional view of conventional split gate nonvolatile memory device.
Figure 2A:
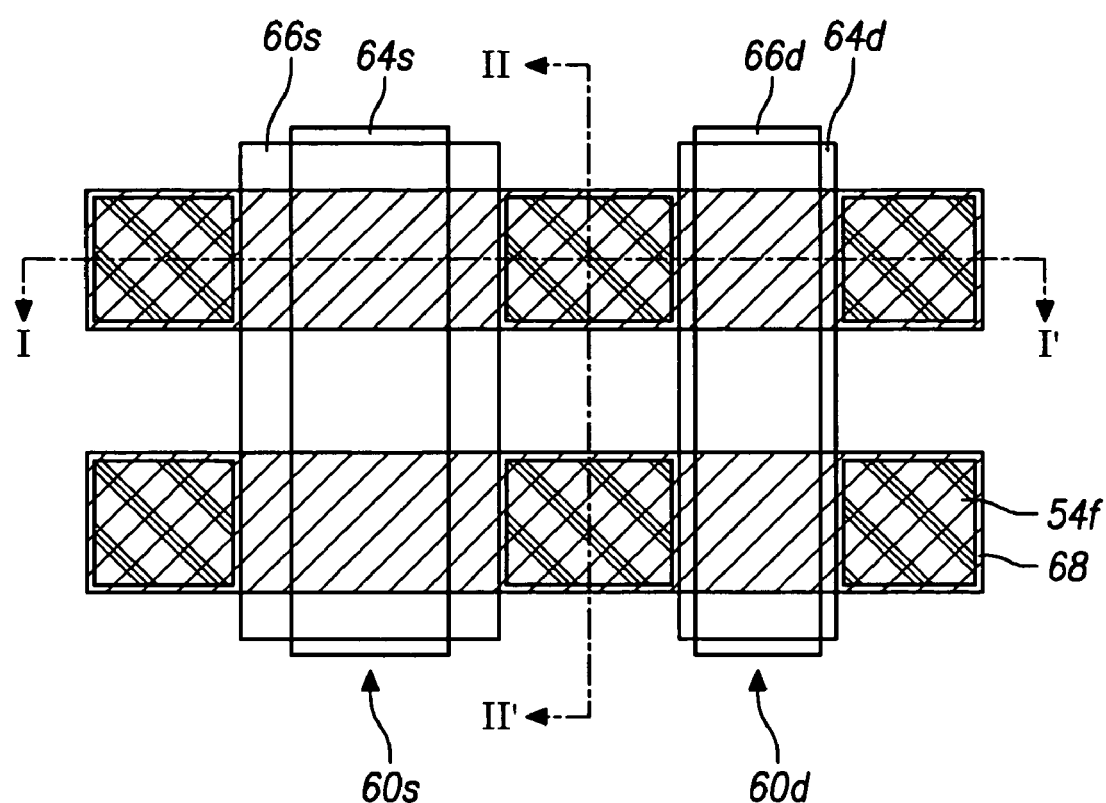
FIG. 2a is a plan view of split gate nonvolatile memory device according to an embodiment of the present invention.
Figure 2B:
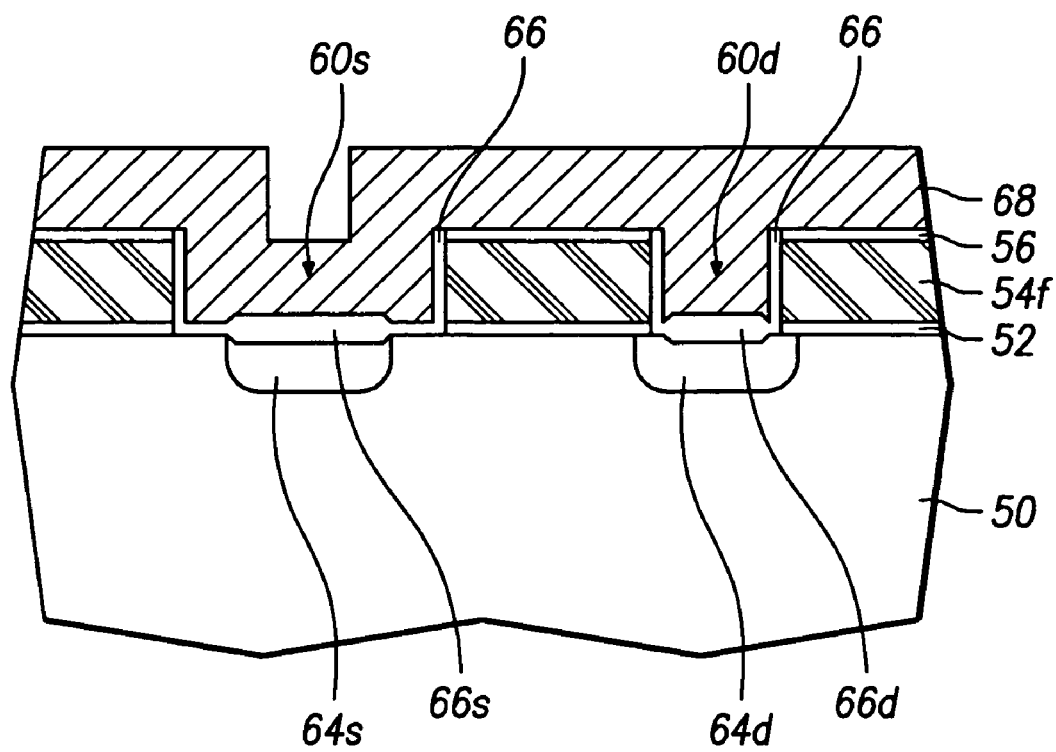
FIGS. 2b and 2c are cross-sectional views when taken along the lines I-I and II-II of FIG. 2a, respectively.
Figure 2C:
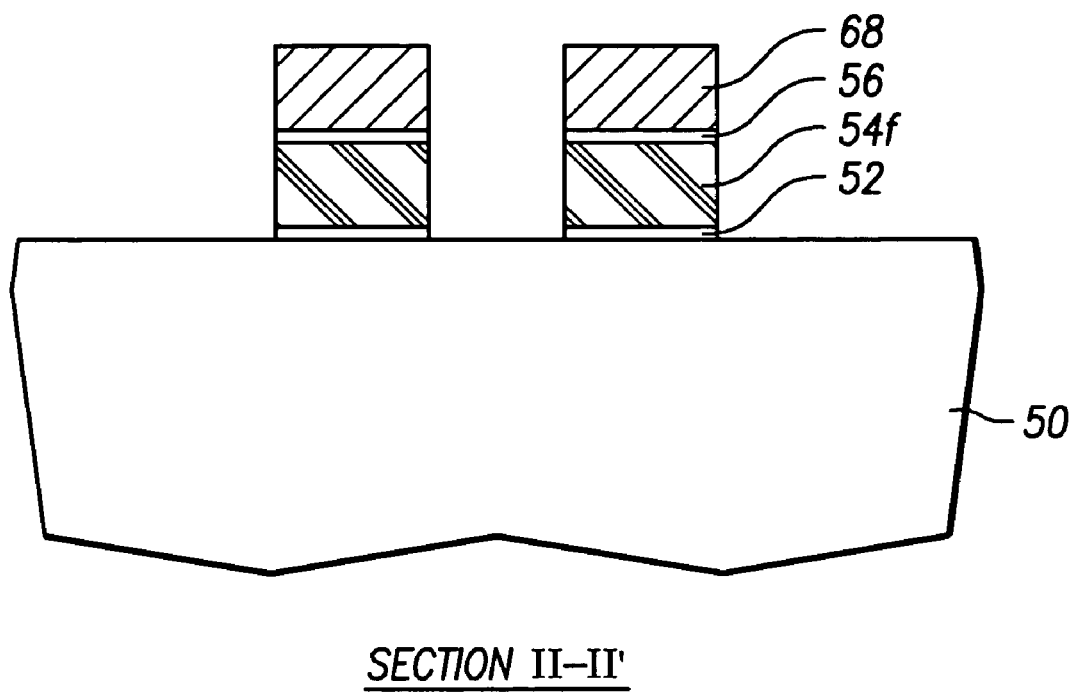

FIG. 2a is a plan view of nonvolatile memory device of the present invention, and FIGS. 2b and 2c are cross-sectional views of memory devices of FIG. 2a when taken along the lines I-I and II-II of FIG. 2a.

Referring to FIGS. 2a, 2b and 2c, a plurality of floating gates 54f extending in row direction of the figures are disposed in column direction. A tunnel oxide film 52 interposes between the floating gate 54f and a semiconductor substrate 50. The floating gates 54f extend over drain and source regions 64d and 64s both of which are formed in the column direction in the substrate. The source regions 64s are formed apart from the floating gate 54f, while the drain regions 64d have overlap portion with the floating gate 54f.

A number of word lines 68 are disposed in parallel to each other over the floating gate 54f. Inter-gate insulating films 56 are formed on the floating gate, and gate oxide films 66 are formed while extending from the floating gate 54f to the source regions 64s. Therefore, the word line 68 and the floating gate 54f are electrically separated by the inter-gate insulating film 56 and the gate oxide film 66.

The source and drain regions 64s and 64d disposed in column direction and word line 68 extends in row direction intersect each other. However they do not contact, because the word line 68 lies over the source and drain regions 64s and 64d. For preventing interaction between the word line 68 and the source and drain regions 64s and 64d, field oxide layers 66s and 66d are disposed therebetween. The field oxide layers 66s and 66d are self-aligned with underlying source and drain regions 64s and 64d. The floating gate 54f is self-aligned with the word line 68.

As explained above, memory cell array of the present invention has a structure that word lines intersect the source and drain regions having strip shapes. Therefore, there is no interface between the active regions and the isolation layer, and hence the conventional problems that oxide films are made thinner at the interface between the active and isolation regions are fundamentally prevented. Further the misalignment of the word line relative to the floating gate cannot occur because the floating gate is self-aligned with the word line 68.

FIGS. 3a, 4a, 5a, 6a are plan views illustrating method for fabricating nonvolatile memory devices according to the present invention, FIGS. 3b, 4b, 5b, 6b are cross-sectional views when taken along the line I-I of FIGS. 3a, 4a, 5a, 6a, respectively, and FIGS. 3c, 4c, 5c, 6c are cross-sectional views when taken along the line II-II of FIGS. 3a, 4a, 5a, 6a, respectively.

Figure 3A:
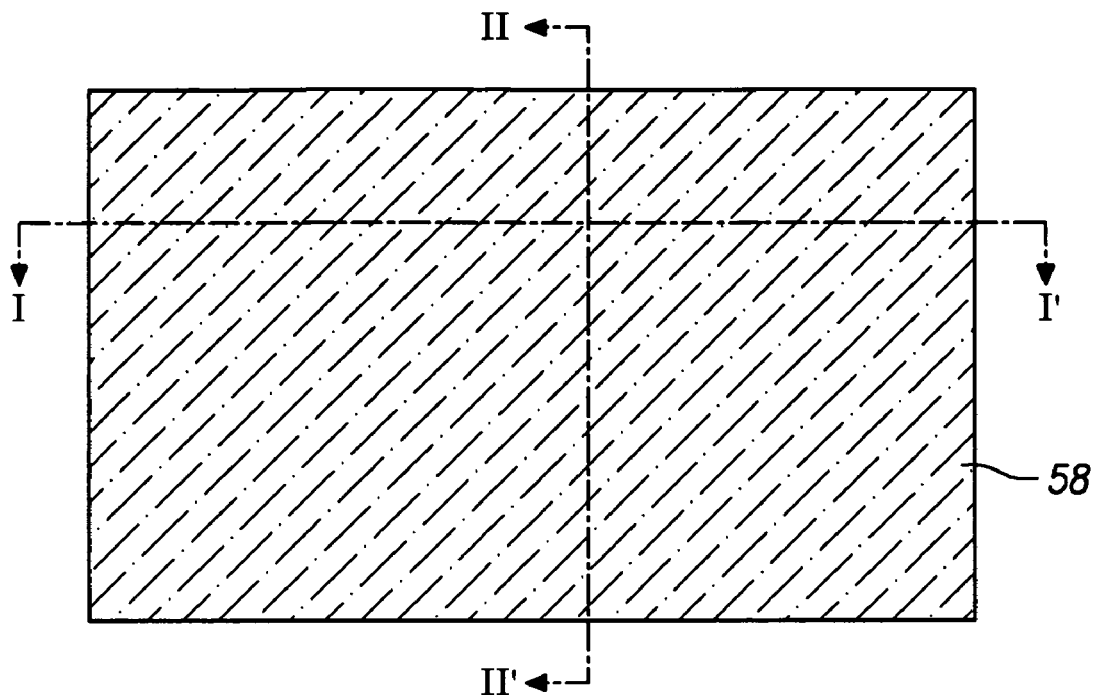
FIGS. 3a, 4a, 5a, and 6a are plan views illustrating fabrication method of nonvolatile memory device according to the present invention.
Figure 3B:
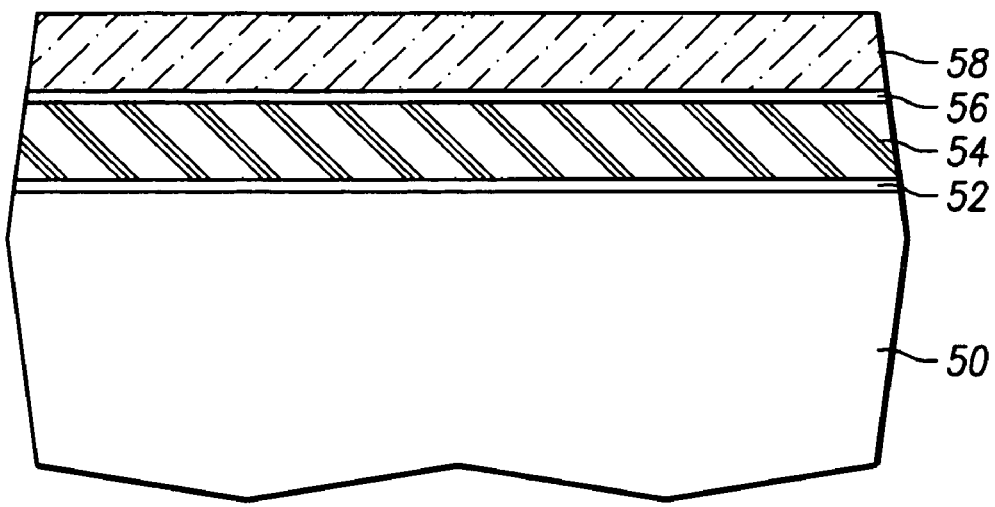
FIGS. 3b, 4b, 5b, 6b and 3c, 4c, 5c, 6c are cross-sectional vies when taken along the lines I-I and II-II of FIGS. 3a, 4a, 5a, 6a, respectively.
Figure 3C:
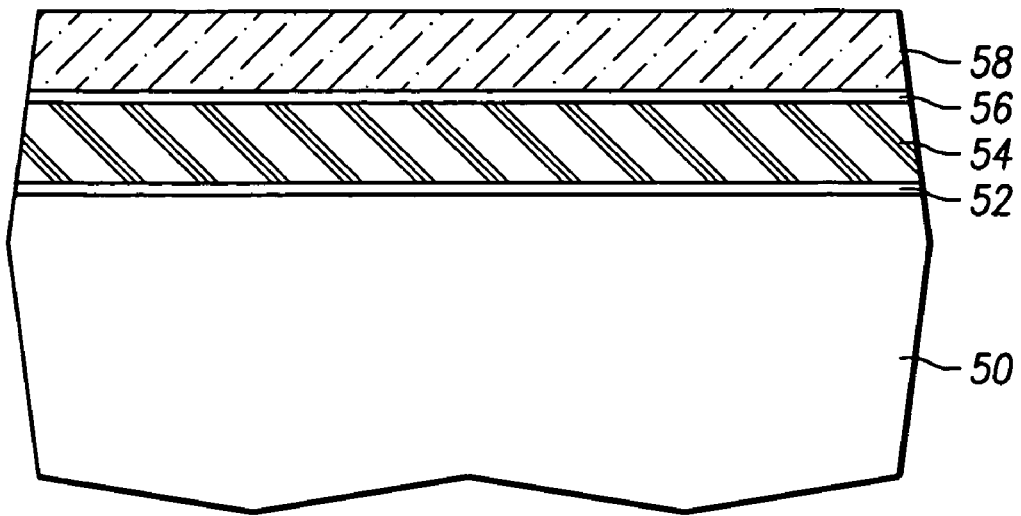

Referring to FIGS. 3a, 3b and 3c, tunnel oxide film 52, floating gate film 54, inter-gate insulating film 56 and hard mask film 58 are successively formed on the substrate 50. The inter-gate insulating film 56 is made of e.g., oxide-nitride-oxide (ONO) material, and the hard mask film 58 is made of e.g., silicon nitride.

Figure 4A:
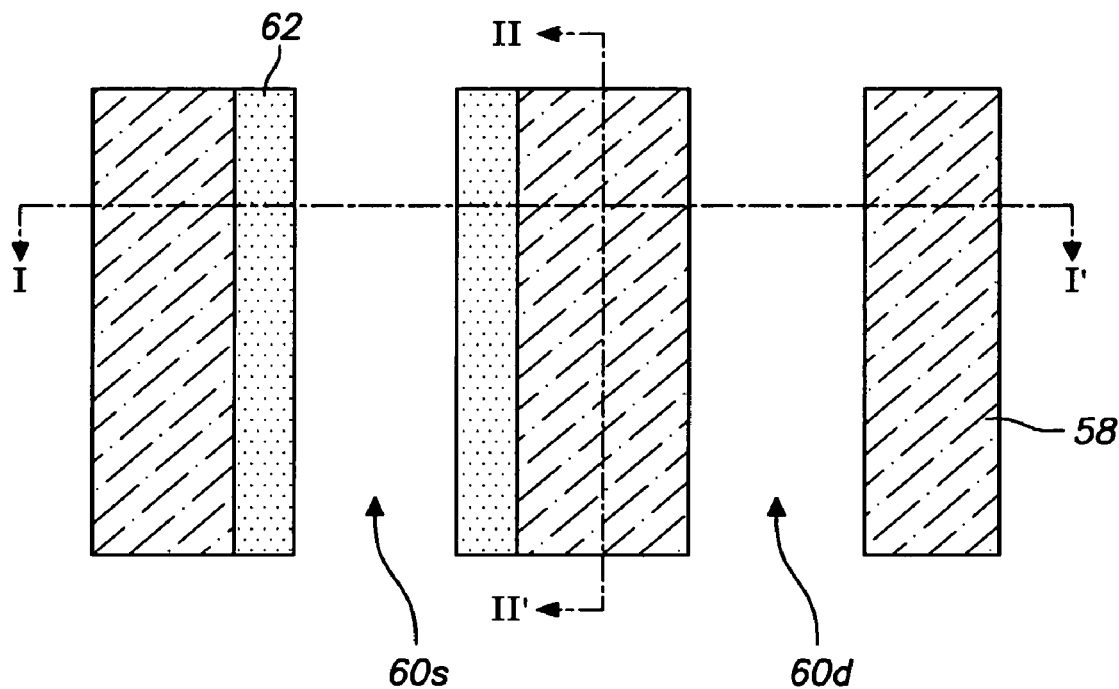
Figure 4B:
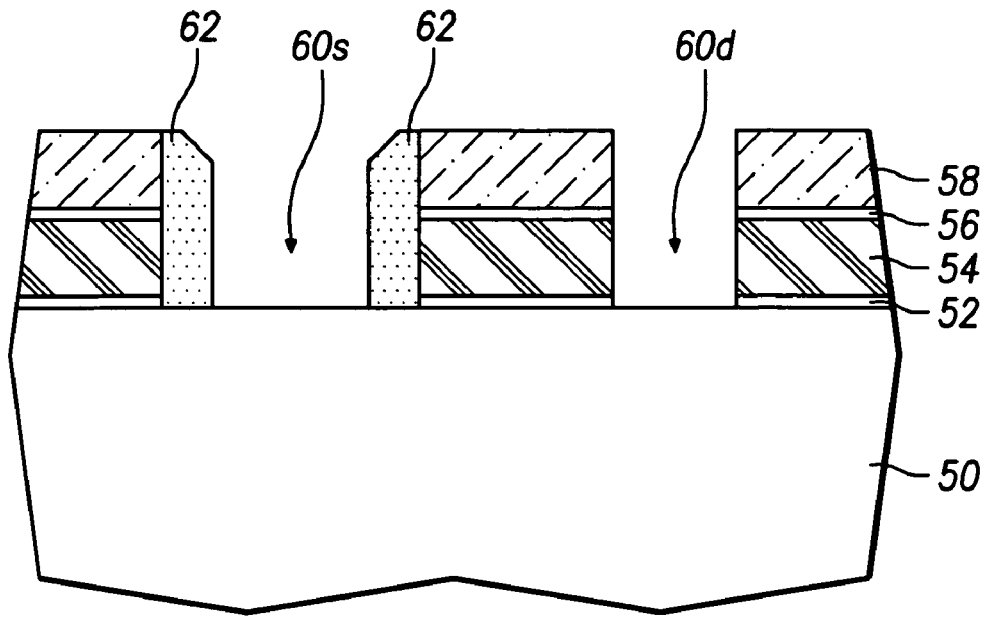
Figure 4C:
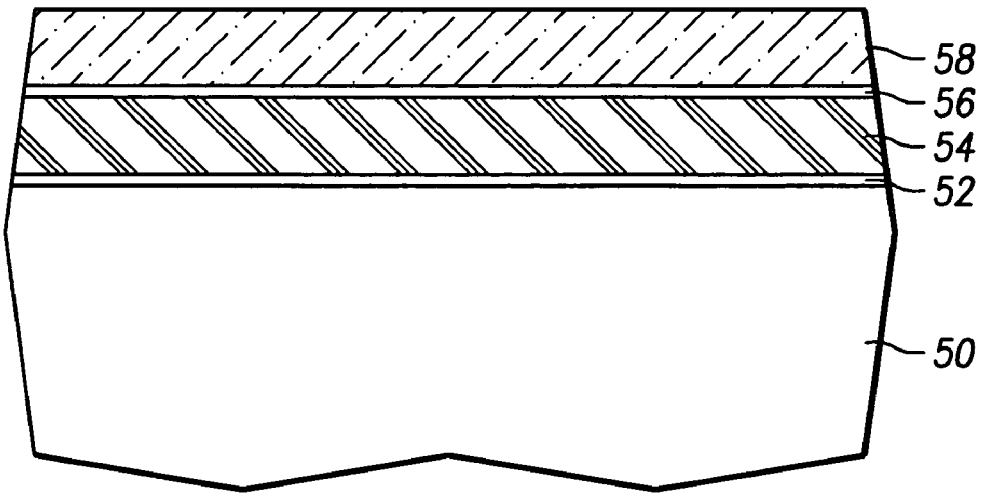

Referring to FIGS. 4a, 4b, and 4c, the hard mask film 58 is patterned to have a strip shape, and then the inter-gate insulating film 56 and the floating gate film 54 are selectively etched with using the hard mask film pattern as a mask to make the floating gate film 54 to be a strip shape. The floating gate patterns have first and second openings 60s and 60d. The tunnel oxide acts as an etch stop layer during the floating gate film 54 is selectively removed. The first opening 60s may have greater width than the second opening 60d.

Spacer patterns 62 are formed at sidewalls of the floating gate pattern 54. Specifically, a conformal oxide layer is formed on the substrate having the floating gate pattern and anistropically etched to form the spacer insulating layers. Subsequently, a mask layer is formed on the first opening 60s, and the spacer insulating layers are removed to leave spacer patterns 62 only one side surface of the floating gate pattern 54 as shown in FIG. 4b. In an embodiment of the present invention, an etch stop layer may be formed before the formation of the conformal oxide layer. The etch stop layer prevents the tunnel oxide film 52 underlying the floating gate pattern 54 from being damaged during the formation of the spacer patterns 62 and during the removal of the spacer insulating layers.

Figure 5A:
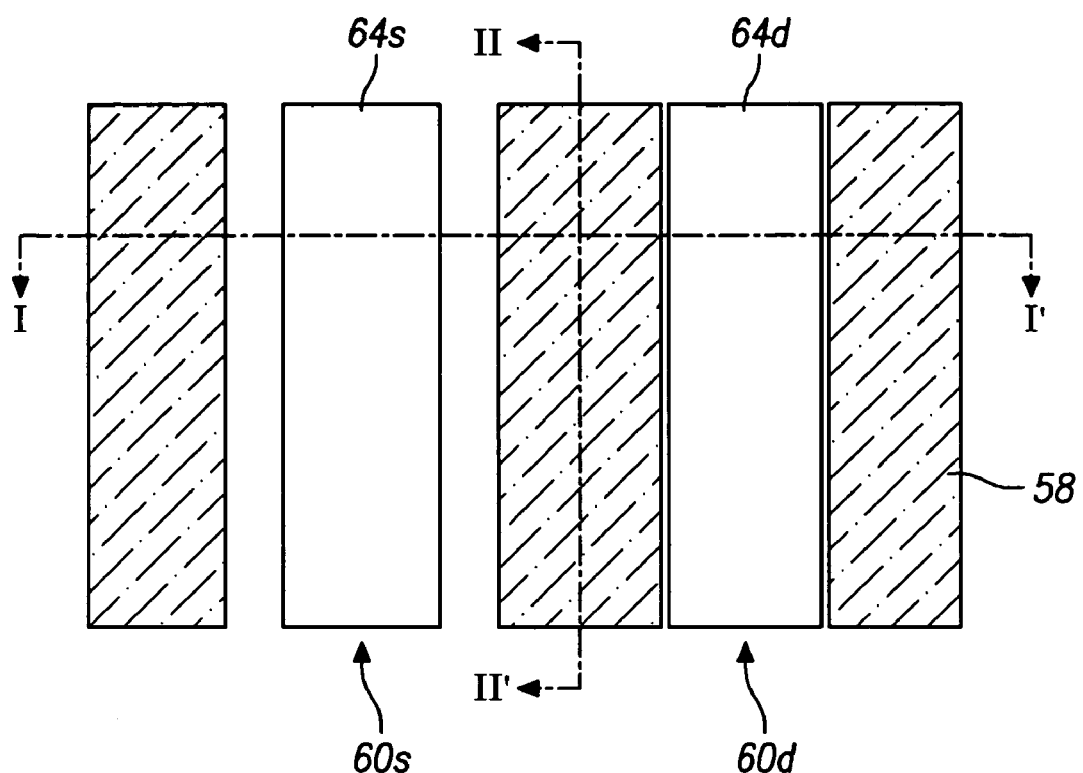
Figure 5B:
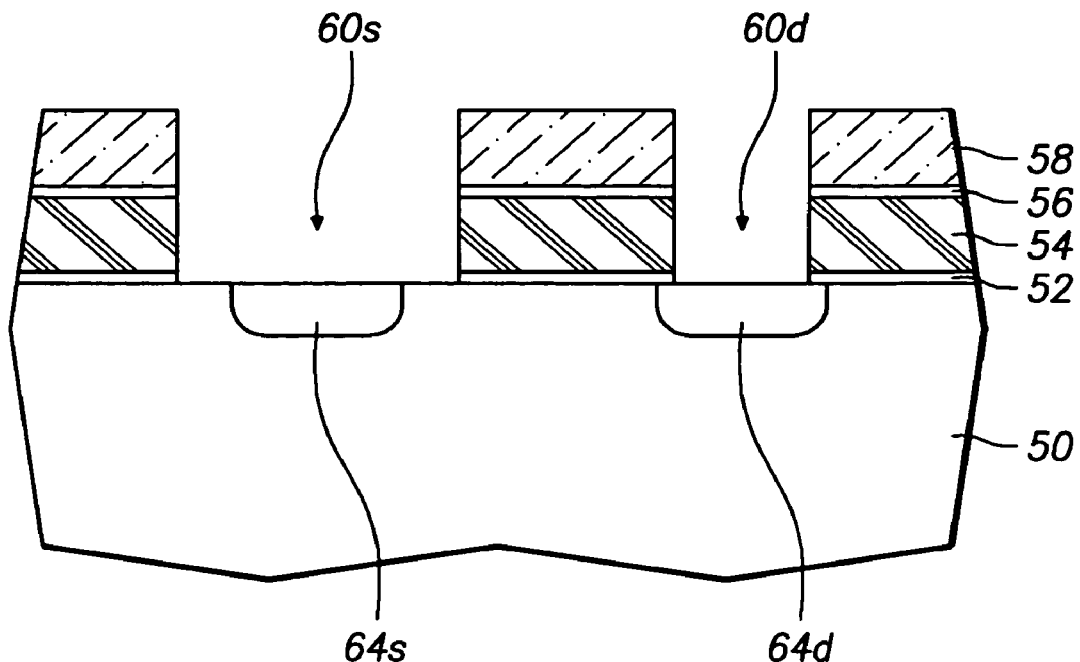
Figure 5C:
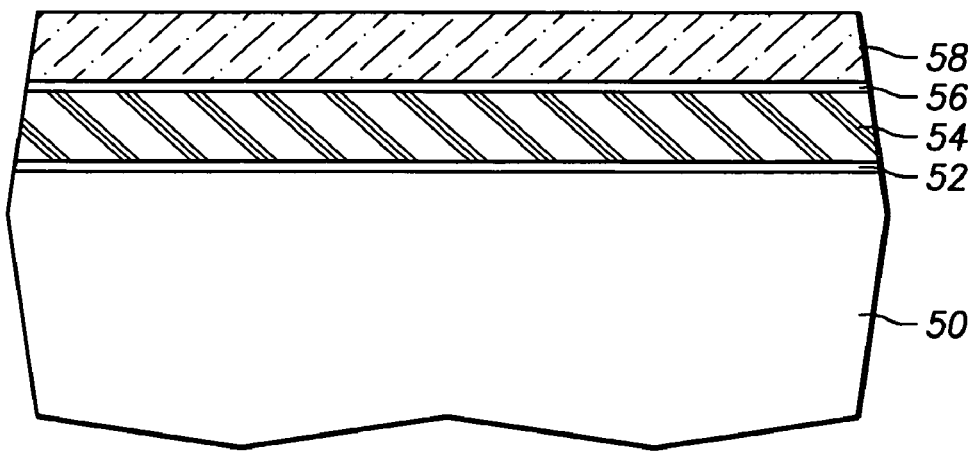

Referring to FIGS. 5a, 5b and 5c, dopants are injected into the substrate to form source regions 64s in the first opening 60s and drain region 64d in the second opening 60d. The source regions 64s are formed apart from the floating gate pattern because the spacer patterns 62 act as a mask, and the drain regions diffuse under and overlap with the floating gate pattern 54.

Subsequently, the spacer patterns 62 are removed. When the etch stop layer is formed before the formation of the spacer patterns 62, the damage of tunnel oxide film 52 is prevented, and the etch stop layer is removed after the removal of the spacer patterns 62.

Figure 6A:
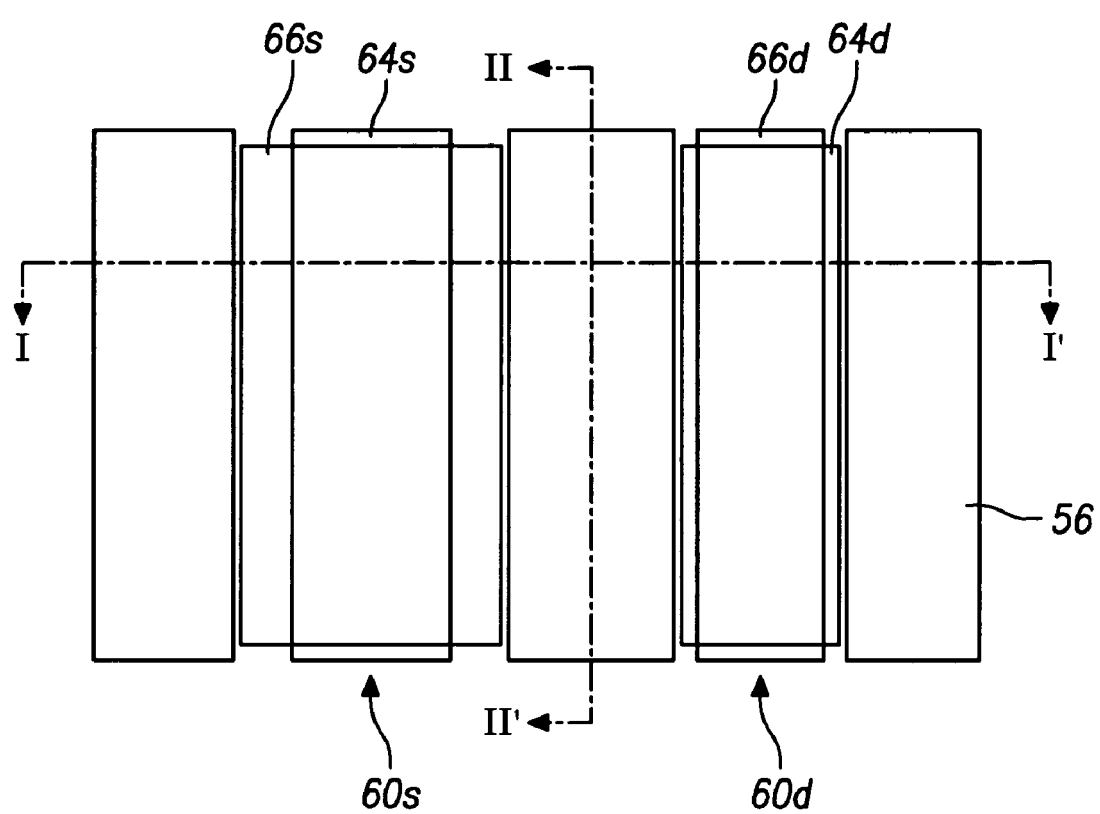
Figure 6B:
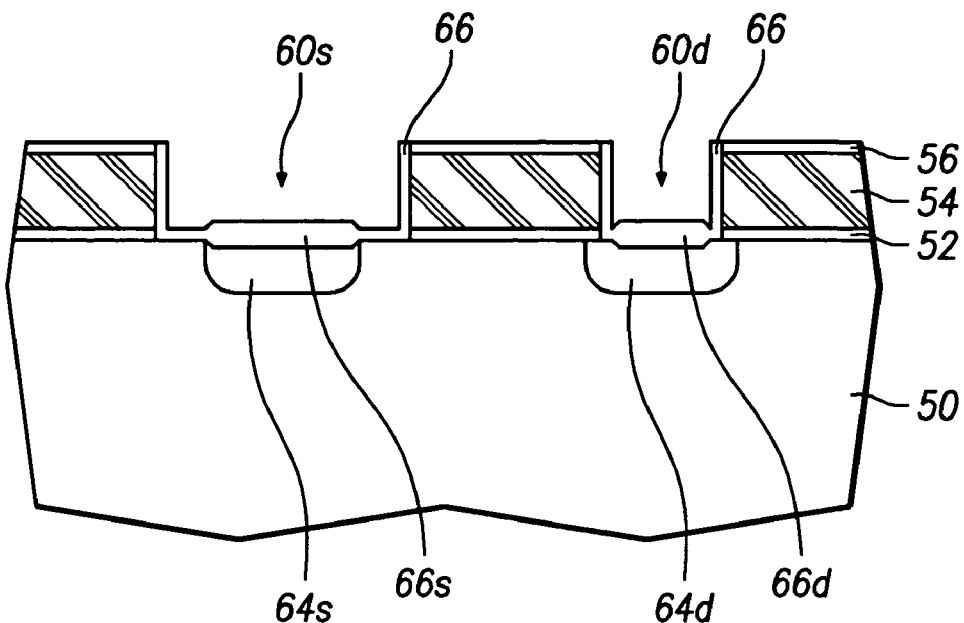
Figure 6C:
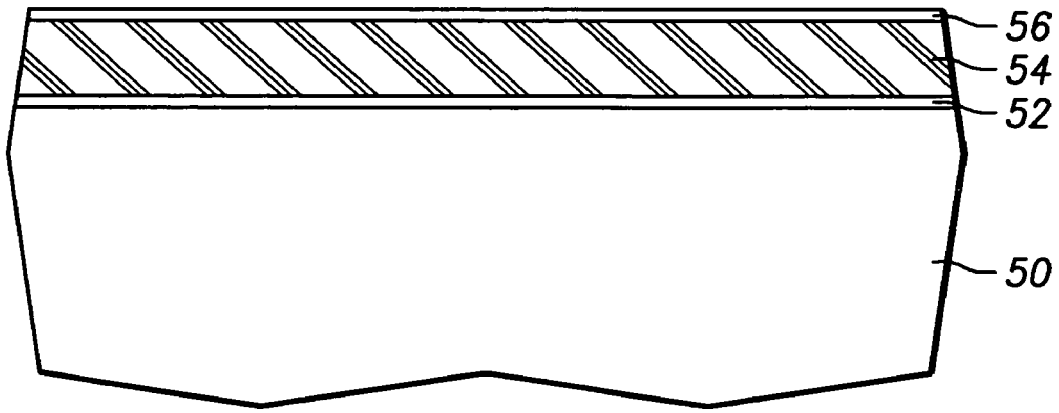

Referring to FIGS. 6a, 6b and 6c, the hard mask film 58 overlying the floating gate pattern is removed to make the inter-gate insulating film 56 to be exposed. The source and drain regions 64s and 64d are formed in parallel at both sides of the floating gate pattern and extend along the column direction of the substrate. A gate oxide layer 66 is formed on portions of the substrate, which are exposed by the first and second openings 60s and 60d and on side of the floating gate patterns. The gate oxide layer 66 may be formed by thermal oxidation. The growth rate of the gate oxide layer 66 is faster on the doped source and drain regions 64s and 64d than on undoped source and drain regions. Consequently, on the source and drain regions 64s and 64d, thicker field oxides 66s and 66d are formed, which are self-aligned with underlying source and drain regions 64s and 64d. The gate oxide layer 66 extends from the field oxides 66s and 66d to active region between the source region 64s and the floating gate 54 and to the sidewalls of the floating gate 54.

Subsequently, a conductive material is deposited on the entire surface of the substrate and patterned to form the word lines 68 passing across the floating gate 54 as shown in FIGS. 2a, 2b and 2c, and the inter-gate film 56 and the floating gate pattern 54 are selectively etched while self aligned with the patterned word line 68 to form a plurality of floating gates 54f below the word line 68.

According to the present invention, drain contacts do not need to be formed on every memory cell since the source and drain regions are formed to have strip shapes. As a result, area for the contacts can be saved, thereby improving integration of the memory device. Furthermore, variation of the conventional overlap is prevented because the floating gate is self-aligned with the word line and thus reliable and stable characteristics of nonvolatile memory devices are ensured.

With the present invention, the isolation region is not formed in the cell array region. Therefore, the conventional problem that insulating layer is made thinner at the interfaces between the active and isolation regions can be avoided.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for fabricating a nonvolatile memory device, said method comprising the steps of:
    forming a tunnel oxide layer on a semiconductor substrate;
    forming a floating gate pattern having a first and second openings on the tunnel oxide layer, the first opening having a width greater than a width of the second opening;
    forming an inter-gate insulating layer on the floating gate pattern;
    forming a drain region in the substrate adjacent to one side of the floating gate pattern, the drain region being overlapped with the floating gate pattern;
    forming a source region in the substrate adjacent to another side of the floating gate, said source region being apart from the floating gate;
    forming a gate oxide layer on a portion of an active region between the source region and the floating gate and on a sidewall of the floating gate directing toward the source region, as well as on a sidewall of the floating gate directing toward the drain region;
    forming field oxide layers on the source and drain regions;
    forming a word line passing across the floating gate; and
    forming a floating gate under the word line by etching the floating gate pattern with self aligned to the word line.

2. The method of claim 1, wherein the step for forming the source and drain regions comprising the steps of:
    forming spacer patterns on sidewalls of the floating gate directing toward the source region;
    injecting dopants into regions of the substrate, which are at both sides of the floating gate pattern, with using the spacer patterns and the floating gate patterns as a etch mask; and
    removing the spacer patterns.

3. The method of claim 1, wherein the gate oxide layer and the field oxide layer are simultaneously formed by thermal oxidation of the substrate at the source and drain regions.

4. The method of claim 1, wherein an inter-gate pattern is formed on the floating gate pattern in the step for forming the floating gate pattern.

5. The method of claim 1, wherein a thickness of the field oxide layers, above the source and drain regions and in a plane parallel to the inter-gate insulating layer, is greater than a thickness of the inter-gate insulating layer.

6. A method for fabricating a nonvolatile memory device, said method comprising the steps of:
    forming a tunnel oxide layer, a floating gate film, an inter-gate insulating film, and a hard mask film, successively over a semiconductor substrate;
    patterning the hard mask film and etching the inter-gate insulating film and the floating gate film, selectively, to define a plurality of strip shaped floating gate pattern, each of said floating gate patterns defining a first opening and a second opening with the adjacent floating gate pattern; and
    forming only one spacer on a side wall of each of the adjacent floating gate patterns, wherein a distance between the sidewalls of the adjacent floating gate patterns having spacers is greater than a distance between the adjacent floating gate patterns without spacers.

7. The method for fabricating a nonvolatile memory device as claimed in claim 6 further comprising:
    injecting dopants into the substrate to form a source region, in the opening defined by the adjacent floating gate patterns having spacers on the side walls, and a drain region, in the other opening.

8. The method for fabricating a nonvolatile memory device as claimed in claim 4, wherein the source region is spaced apart from the adjacent floating gate patterns having spacers on the side walls and the drain region is overlapped by the adjacent floating gate patterns having without spacers.

9. The method for fabricating a nonvolatile memory device as claimed in claim 8, further comprising the steps of:
    removing said spacers;
    exposing the inter-gate insulating film by removing the hard mask film;
    forming a field oxide layer on a portion of the substrate exposed by the first opening and the second opening and on the side walls of the floating gate patterns defining the first and second openings;
    forming a word line passing across the floating gate; and
    forming a floating gate under the word line by etching the floating gate pattern with self aligned to the word line.

10. The method for fabricating a nonvolatile memory device as claimed in claim 9 wherein a thickness of the field oxide layer, above the source and drain regions and in a plane parallel to the inter-gate insulating film, is greater than a thickness of the inter-gate insulating film.

* * * * *